(12) United States Patent
Shie

(10) Patent No.: US 7,755,370 B2
(45) Date of Patent: Jul. 13, 2010

(54) METHOD FOR EXAMINING BONDING RESISTANCE

(75) Inventor: De-Ching Shie, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 436 days.

(21) Appl. No.: 11/985,087

(22) Filed: Nov. 13, 2007

(65) Prior Publication Data

US 2008/0111564 A1    May 15, 2008

(30) Foreign Application Priority Data

Nov. 10, 2006    (TW) .............................. 95141776 A

(51) Int. Cl.
*G01R 27/08* (2006.01)
*G01R 31/00* (2006.01)

(52) U.S. Cl. ...................................... 324/713; 324/770

(58) Field of Classification Search ................... 324/713
See application file for complete search history.

(56) References Cited

U.S. PATENT DOCUMENTS 5,365,180 A * 11/1994 Edelman ...................... 324/715
5,933,309 A * 8/1999 Smith ........................... 361/88
7,029,932 B1 * 4/2006 Hiser et al. .................... 438/14
7,064,563 B2 * 6/2006 Ho et al. ...................... 324/713
7,129,718 B2 * 10/2006 Ho et al. ...................... 324/713

FOREIGN PATENT DOCUMENTS

CN          1517673 A       8/2004

* cited by examiner

Primary Examiner—Jeff Natalini
(74) Attorney, Agent, or Firm—Wei Te Chung

(57) ABSTRACT

An exemplary method for examining bonding resistance includes providing a first electronic component having a first and second reference pins. A second electronic component having a third and fourth reference pins is also provided. A first input voltage is applied to the first reference pin. A bias resistor connected between the third reference pin and ground is provided, with the third reference pin serving as an output for providing a first reference voltage. The first reference voltage is measured. Bonding resistance between the first reference pin and the third reference pin is evaluated according to the measured first reference voltage.

15 Claims, 3 Drawing Sheets

METHOD FOR EXAMINING BONDING RESISTANCE

FIELD OF THE INVENTION

The present invention relates to methods for examining bonding resistance, and more particularly to a method typically used for examining bonding resistance between two integrated circuits of an electronic product such as a liquid crystal display (LCD). In this description, unless the context indicates otherwise, the term "bonding resistance" refers to electrical resistance where two or more electronic components are mechanically bonded together.

GENERAL BACKGROUND

Presently, integrated circuits are widely used in various electronic products such as mobile phones, personal digital assistants, and liquid crystal displays. These kinds of electronic products usually need a lot of components to be electrically connected together. For example, in an LCD, the components can include integrated circuits (ICs), glass substrates, flexible printed circuits (FPCs), and printed circuit boards (PCBs), which are packaged together in the form of a module bonding structure. Generally, module bonding technologies for LCDs include chip on glass (COG) technology, tape automated bonding (TAB) technology, film on glass (FOG) technology, chip on board (COB) technology, and chip on film (COF) technology. A conductive bonding material for bonding two electronic components together, such as an anisotropic conductive film (ACF), is usually needed.

Referring to FIG. 5, a typical module bonding structure 10 includes a first IC 11, a second IC 12, an FPC 13, and a glass substrate 14. The first IC 11 is bonded on the glass substrate 14 by COG technology. The second IC 12 is bonded on an end of the FPC 13 by COF technology. The other end of the FPC 13 is bonded on the glass substrate 14 by COG technology.

Referring also to FIG. 6, this is essentially an abbreviated circuit diagram of the module bonding structure 10. The glass substrate 14 includes a plurality of conductive lines (not shown) therein. The FPC 13 includes a plurality of metal wires (not shown). The first IC 11 includes a plurality of first pins A1~An (n is a natural number). The second IC 12 includes a plurality of second pins B1~Bn. The first pins A1~An correspond to the second pins B1~B2 one-to-one. The first pins A1~An are electrically connected to the corresponding second pins B1~Bn via the conductive lines of the glass substrate 14 and the metal wires of the FPC 13, respectively. Normally, a bonding resistance inevitably exists in a bonding area because of a resistance of the bonding material and the ICs. Taking the first pin A1 and the second pin B1 as an example, R1 is a resistance between the first pin A1 and the glass substrate 14, R2 is a combined resistance of the metal wire of the glass substrate 14 corresponding to the first pin A1 plus the conductive line of the FPC 13 corresponding to the second pin B1, and R3 is a resistance between the FPC 13 and the second pin B1. Thus, a bonding resistance R between the first pin A1 and the second pin B1 is equal to the sum of R1, R2 and R3.

In general, the bonding resistance R has a maximum tolerance value, in order to meet requirements of stable and reliable operation when the module bonding structure 10 is used in an electronic product such as an LCD. However, during the process of manufacturing the module bonding structure 10, it is difficult to keep the bonding resistance R in a normal range below the maximum tolerance value. If the maximum tolerance value is exceeded, working signals of the module bonding structure 10 are liable to be adversely affected, and the module bonding structure 10 may not work accurately and stably.

What is needed, therefore, is a method for examining bonding resistance that can help overcome the above-described deficiencies.

SUMMARY

In one preferred embodiment, a method for examining a bonding resistance includes providing a first electronic component having a first and second reference pins. A second electronic component having a third and fourth reference pins is also provided. A first input voltage is applied to the first reference pin. A bias resistor connected between the third reference pin and ground is provided, with the third reference pin serving as an output for providing a first reference voltage. The first reference voltage is measured. Bonding resistance between the first reference pin and the third reference pin is evaluated according to the measured first reference voltage.

Other aspects, novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of at least one embodiment of the present invention. In the drawings, like reference numerals designate corresponding parts throughout various views, and all the views are schematic.

DETAILED DESCRIPTION OF PREFERRED EMBODIMENTS

Reference will now be made to the drawings to describe preferred and exemplary embodiments in detail.

Figure 1:
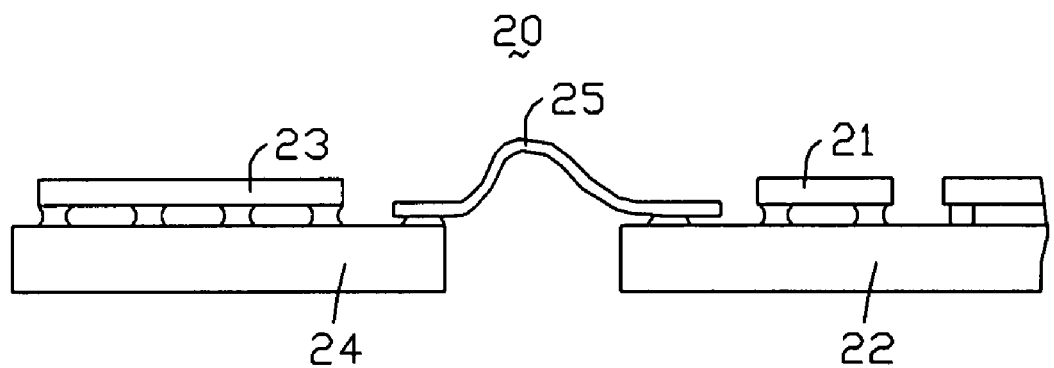
FIG. 1 is a side-on view of an exemplary module bonding structure used in an examining method according to any of various embodiments of the present invention.

Referring to FIG. 1, a module bonding structure 20 according to an exemplary embodiment of the present invention is shown. The module bonding structure 20 includes a first IC 21, a second IC 23, an FPC 25, a PCB 24, and a glass substrate 22.

The first IC 21 is bonded on a main portion of the glass substrate 22. The second IC 23 is bonded on a main portion of the PCB 24. One end portion of the FPC 25 is bonded on an end portion of the glass substrate 22, and the other end portion of the FPC 25 is bonded on an end portion of the PCB 24.

Figure 2:
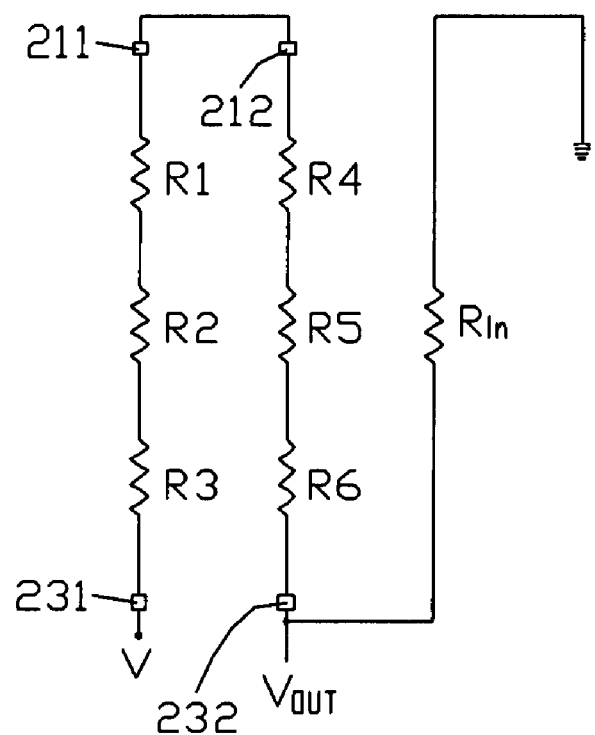
FIG. 2 is a circuit diagram illustrating an examining method according to a first embodiment of the present invention, the examining method being applied to the module bonding structure of FIG. 1.

Referring also to FIG. 2, this is a circuit diagram illustrating an examining method according to a first embodiment of the present invention, the examining method being applied to the module bonding structure 20. The first IC 21 includes a plurality of first signal pins (not shown), a first reference pin 211, and a second reference pin 212. The second IC 23 includes a plurality of second signal pins (not shown) corresponding to the first signal pins, a third reference pin 231, and a fourth reference pin 232. The first and second reference pins 211, 212 correspond to the third and fourth reference pins 231, 232, respectively. The first signal pins, the first reference pin 211, and the second reference pin 212 are mutually insulated. The second signal pins, the third reference pin 231, and the fourth reference pin 232 are mutually insulated. R1 is a resistance between the first reference pin 211 and the glass substrate 22. R4 is a resistance between the second reference pin 212 and the glass substrate 22. R2 is a resistance between the glass substrate 22 and the PCB 24 corresponding to the first reference pin 211 (including a resistance between the glass substrate 22 and the FPC 25, and a resistance between the FPC 25 and the PCB 24 corresponding to the first reference pin 211). R5 is a resistance between the glass substrate 22 and the PCB 24 corresponding to the second reference pin 212 (including a resistance between the glass substrate 22 and the FPC 25 and a resistance between the FPC 25 and the PCB 24 corresponding to the second reference pin 212). R3 is a resistance between the PCB 24 and the third reference pin 231. R6 is a resistance between the PCB 24 and the fourth reference pin 232. Working signals of the module bonding structure 20 are transferred between the first signal pins and the corresponding second signal pins. A bonding resistance R between the third reference pin 231 and the fourth reference pin 232 is equal to the sum of R1, R2, R3, R4, R5, and R6. A maximum tolerance value of the bonding resistance R is defined as Rmax.

When the bonding resistance R is examined, the third reference pin 231 has an input voltage V applied thereto.

The first and second reference pins 211, 212 are connected to each other.

The fourth reference pin 232 is connected to ground via a bias resistor Rin. The fourth reference pin 232 serves as an output for providing a reference voltage Vout. The reference voltage Vout is also a drop voltage of the bias resistor Rin. Thus, the third reference pin 231 is electrically connected to ground via R3, R2, R1, the first reference pin 211, the second reference pin 212, R4, R5, R6, and Rin, which together constitute a series branch.

Then, the reference voltage Vout is measured from the fourth reference pin.

A minimum value of the reference voltage Vout is calculated. The reference voltage Vout can also be calculated according to the following equations:

$V = Vout + I*R$ ($I$ represents a current of the series branch);

$Vout = I*Rin$;

Accordingly, $Vout = (V*Rin)/(R+Rin)$.

Because the bonding resistance R is not more than the Rmax ($R \leq Rmax$), then the theoretical reference voltage $Vout = (V*Rin)/(R+Rin) \geq (V*Rin)/(Rmax+Rin)$. If one defines a minimum value of the reference voltage Vout as Vmin, then $Vmin = (V*Rin)/(Rmax+Rin)$.

The bonding resistance R is examined. When the reference voltage Vout as measured is less than Vmin, the bonding resistance R is greater than Rmax.

Thus, once Rin and Rmax are confirmed, the bonding resistance R can be examined by measuring the reference voltage Vout. If the measured reference voltage Vout is less than Vmin, the bonding resistance is abnormal. If the measured reference voltage Vout is equal to or greater than Vmin, the bonding resistance is normal.

Figure 3:
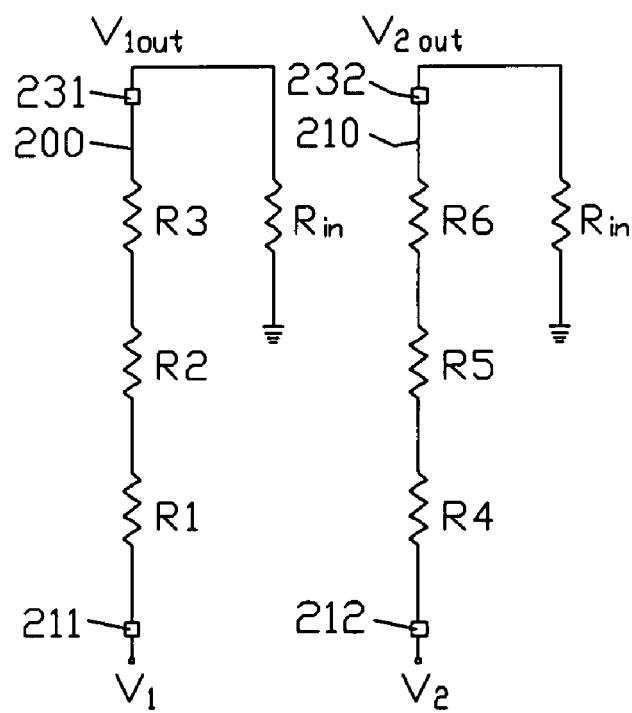
FIG. 3 is a circuit diagram illustrating an examining method according to a second embodiment of the present invention, the examining method being applied to the module bonding structure of FIG. 1.

Referring to FIG. 3, this is a circuit diagram illustrating an examining method according to a second embodiment of the present invention, the examining method being applied to the module bonding structure 20.

The first reference pin 211 is connected to a first input voltage V1.

The third reference pin 231 is connected to ground via a bias resistor Rin. The first reference pin 211, the third reference pin 231, and the bias resistor Rin constitute a first series branch 200. The third reference pin 231 serves as an output for providing a first reference voltage V1 out.

The first reference voltage V1out is measured from the third reference pin 231.

A minimum value of the first reference voltage V1out is calculated. A maximum resistance of (R1+R2+R3) is defined as R1max. Thus, V1out meets the following formula:

$V1out \geq (V1*Rin)/(R1max+Rin)$

If one defines the minimum value of the first reference voltage V1out as V1min, then $V1min = (V1*Rin)/(R1max+Rin)$. Thus, once the values of the bias resistor Rin, the R1max, and the first input voltage V1 are confirmed, a bonding resistance of the first branch 200 can be examined by comparing the measured value of V1out to the computed value of $(V1*Rin)/(R1max+Rin)$.

The second reference pin 212 is coupled to a second input voltage V2.

The fourth reference pin 232 is connected to ground via the bias resistor Rin. The second reference pin 212, the fourth reference pin 232, and the bias resistor Rin constitute a second series branch 210. The fourth reference pin 232 serves as an output for providing a second reference voltage V2out.

The second reference voltage V2out is measured from the fourth reference pin 231.

A minimum value of the second reference voltage V2out is calculated. A maximum resistance of (R4+R5+R6) is defined as R2max. Thus, V1out meets the following formula:

$V2out \geq (V2*Rin)/(R2max+Rin)$

If one defines the minimum value of the second reference voltage V2out as V2min, then $V2min = (V2*Rin)/(R2max+Rin)$. Thus, once the values of the bias resistor Rin, the R2max, and the second input voltage V2 are confirmed, a bonding resistance of the second branch 210 can be examined by comparing the measured value of V2out to the calculated value of $(V2*Rin)/(R2max+Rin)$.

Figure 4:
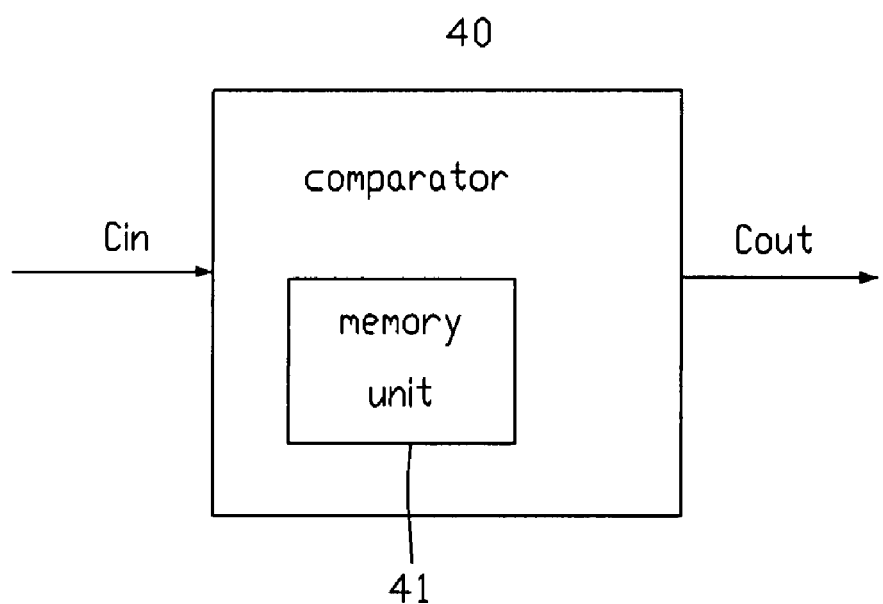
FIG. 4 is a block diagram of a comparator used in any of various embodiments of the present invention.
Figure 5:
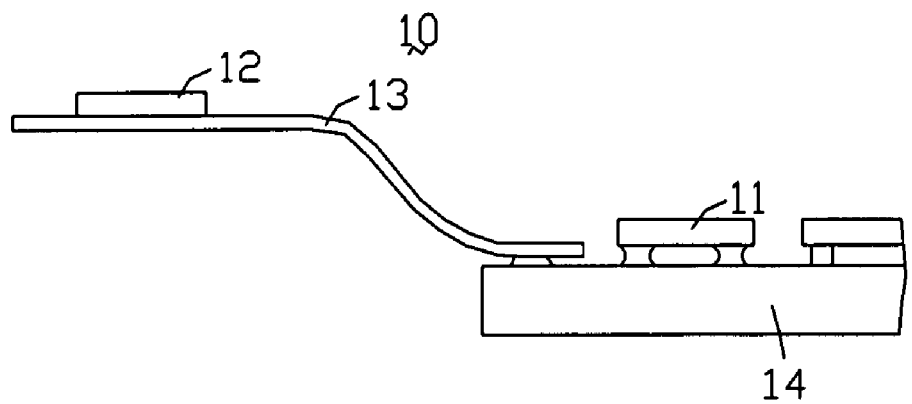
FIG. 5 is a side-on view of a conventional module bonding structure.
Figure 6:
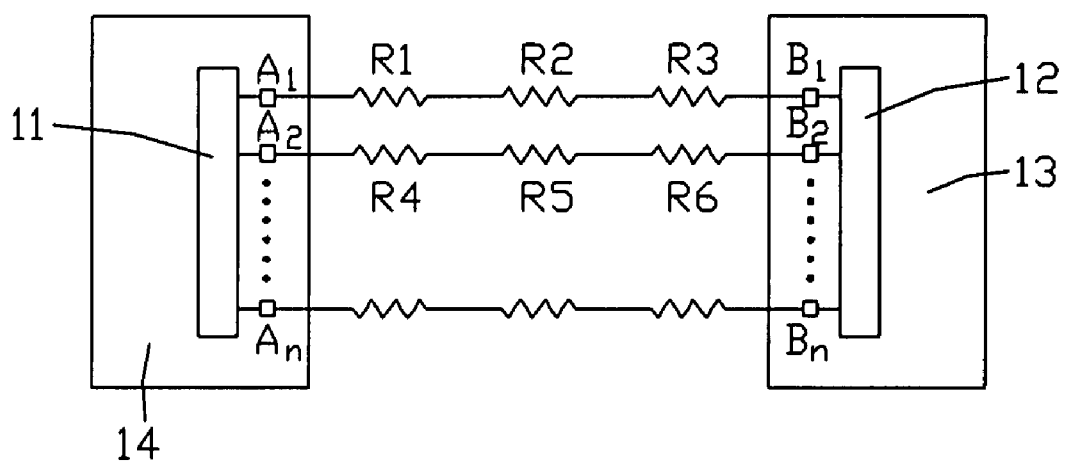
FIG. 6 is essentially an abbreviated circuit diagram of the module bonding structure of FIG. 5.

Referring to FIG. 4, this shows a comparator 40 that can be used in either of the above-described first and second embodiments of the present invention. In general, the comparator 40 can compare a value of a received voltage Cin to a pre-stored voltage value, and can output a comparison signal Cout representing a result of the comparison. Thus the above-described comparing processes of the first and second embodiments can be performed by the comparator 40. The comparator 40 includes a memory unit 41 for storing the values of Vmin, V1min, and V2min. The comparator 40 receives the reference voltages Vout, V1out, and V2out, and compares the reference voltages Vout, V1out, and V2out to Vmin, V1min, and V2min respectively. If $Vout \geq min$, or $V1out \geq V1min$, or $V2out \geq V2min$, the comparator 40 outputs a high-level comparison signal Cout to indicate that the bonding resistance examined is normal and satisfactory. Otherwise, the comparator outputs a low-level comparison signal Cout to indicate that the bonding resistance examined is abnormally high and not satisfactory.

Further or alternative embodiments may include the following. In one example, the first and second reference pins 211, 212 can also be two first signal pins, and the third and fourth reference pins 231, 232 can also be two second signal pins.

It is believed that the present embodiments and their advantages will be understood from the foregoing description, and it will be apparent that various changes may be made thereto without departing from the spirit or scope of the invention or sacrificing all of its material advantages, the examples hereinbefore described merely being preferred or exemplary embodiments of the invention.

What is claimed is:

1. A method for examining bonding resistance of a module bonding structure, the method comprising:
    providing a first electronic component of the module bonding structure, the first electronic component having a first reference pin and a second reference pin;
    providing a second electronic component of the module bonding structure, the second electronic component having a third reference pin corresponding to the first reference pin and a fourth reference pin corresponding to the second reference pin;
    providing an electrically conductive body respectively bonded with the first electronic component and the second electronic component such that the first reference pin is electrically connected to the third reference pin, and the second reference pin is electrically connected to the fourth reference pin;
    applying a first input voltage to the first reference pin;
    providing a bias resistor connected between the third reference pin and ground, wherein the first reference pin, the third reference pin and the bias resistor constitute a series branch, and the third reference pin serves as an output for providing a first reference voltage;
    measuring the first reference voltage; and
    evaluating bonding resistance between the first reference pin and the third reference pin according to the measured first reference voltage.

2. The method in claim 1, further comprising:
    applying a second input voltage to the second reference pin;
    providing a bias resistor connected between the fourth reference pin and ground, wherein the second reference pin, the fourth reference pin and the bias resistor constitute a series branch, and the fourth reference pin serves as an output for providing a second reference voltage;
    measuring the second reference voltage; and
    evaluating bonding resistance between the second reference pin and the fourth reference pin according to the measured second reference voltage.

3. The method in claim 2, wherein evaluating bonding resistance between the second reference pin and the fourth reference pin according to the measured second reference voltage comprises:
    determining a maximum value of bonding resistance between the second reference pin and the fourth reference pin;
    calculating a minimum value of the second reference voltage according to the maximum value of bonding resistance between the second reference pin and the fourth reference pin, the second input voltage, and the resistance of the bias resistor; and
    comparing the measured second reference voltage to the minimum value of the second reference voltage.

4. The method in claim 3, wherein the evaluating of bonding resistance between the second reference pin and the fourth reference pin according to the second reference voltage is performed by a comparator, the comparator comprising a memory for storing minimum values of the first and second reference voltages.

5. The method in claim 4, wherein the comparator outputs a high level signal when the measured first or second voltage is greater than the corresponding minimum value, and outputs a low level signal when the measured first or second voltage is less than the corresponding minimum value.

6. The method in claim 1, wherein evaluating bonding resistance between the first reference pin and the third reference pin according to the measured first reference voltage comprises:
    determining a maximum value of bonding resistance between the first reference pin and the third reference pin;
    calculating a minimum value of the first reference voltage according to the maximum value of bonding resistance between the first reference pin and the third reference pin, the first input voltage, and the resistance of the bias resistor; and
    comparing the measured first reference voltage to the minimum value of the first reference voltage.

7. The method in claim 1, wherein the first electronic component further comprises a plurality of first pins, and the second electronic component further comprises a plurality of second pins corresponding to the first pins.

8. The method in claim 1, wherein each of the first and second electronic components is an integrated circuit.

9. The method in claim 1, wherein the electrically conductive body is a flexible printed circuit.

10. A method for evaluating bonding resistance of a module bonding structure, the method comprising:
    providing a first electronic component of the module bonding structure, the first electronic component having a plurality of first pins, the first pins comprising a first reference pin and a second reference pin;
    providing a second electronic component of the module bonding structure, the second electronic component having a plurality of second pins corresponding to the first pins, the second pins comprising a third reference pin and a fourth reference pin;
    providing an electrically conductive body respectively bonded with the first electronic component and the second electronic component such that the first pins are electrically connected to corresponding second pins;
    applying an input voltage to the third reference pin;
    connecting the first reference pin and the second reference pin together;
    providing a bias resistor connected between the fourth reference pin and ground, wherein the third reference pin, the first reference pin, the second reference pin, the fourth reference pin and the bias resistor constitute a series branch;
    measuring a voltage drop of the bias resistor; and
    evaluating bonding resistance between the third reference pin and the fourth reference pin.

11. The method in claim 10, wherein evaluating bonding resistance between the second reference pin and the fourth reference comprises:
    determining a maximum value of bonding resistance between the third reference pin and the fourth reference pin;
    calculating a minimum value of the voltage drop of the bias resistor according to the maximum value of bonding resistance between the third reference pin and the fourth reference pin, the first input voltage, and a resistance of the bias resistor; and comparing the measured voltage drop to the minimum value.

12. The method in claim 11, wherein the evaluating of bonding resistance between the second reference pin and the fourth reference pin is performed in a comparator, the comparator comprising a memory for storing the minimum value of voltage drop of the bias resistor.

13. The method in claim 12, wherein the comparator is configured for comparing a measured voltage drop to the minimum value of the voltage drop, outputting a high level signal when the measured voltage drop is equal to or greater than the first minimum value or the second minimum value, and outputting a low level signal when the measured voltage drop is less than the first minimum value or the second minimum value.

14. The method in claim 10, wherein each of the first and second electronic components is an integrated circuit.

15. The method in claim 10, wherein the electrically conductive body is one of a flexible printed circuit, a glass substrate, and a flexible printed circuit bonded to a glass substrate.

* * * * *